United States Patent
Tochishita et al.

(10) Patent No.: US 8,426,315 B2
(45) Date of Patent: Apr. 23, 2013

(54) METHOD OF MANUFACTURING SEMICONDUCTOR DEVICE

(75) Inventors: Shouji Tochishita, Hyogo (JP); Kenji Nishihara, Hyogo (JP); Tohru Haruki, Hyogo (JP); Tadao Uehara, Hyogo (JP); Kiyotaka Ishibushi, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 847 days.

(21) Appl. No.: 11/525,658

(22) Filed: Sep. 22, 2006

(65) Prior Publication Data

US 2007/0072430 A1 Mar. 29, 2007

(30) Foreign Application Priority Data

Sep. 27, 2005 (JP) ................................. 2005-280684

(51) Int. Cl.
*H01L 21/302* (2006.01)
*H01L 21/461* (2006.01)

(52) U.S. Cl.
USPC .......................................... 438/704; 438/725

(58) Field of Classification Search .................. 438/689, 438/704, 725, 710; 430/394, 313, 328
See application file for complete search history.

(56) References Cited

U.S. PATENT DOCUMENTS

| | | | | |
|---|---|---|---|---|
| 5,885,756 | A * | 3/1999 | Yun et al. ........................ | 430/394 |
| 2004/0241886 | A1* | 12/2004 | Hong et al. ......................... | 438/7 |
| 2004/0253827 | A1* | 12/2004 | Hendriks et al. ............... | 438/710 |

FOREIGN PATENT DOCUMENTS

| | | |
|---|---|---|
| JP | 6-224117 | 8/1994 |
| JP | 8-97192 | 4/1996 |
| JP | 8-250481 | 9/1996 |
| JP | 9-326359 | 12/1997 |
| JP | 2000-12527 | 1/2000 |
| JP | 2001-237231 | 8/2001 |

OTHER PUBLICATIONS

Wolf (Silicon Processing for the VLSI Era, vol. 1—Process Technology, Lattice Press, 1986, pp. 407-409).*
S. Wolf and R.N. Tauber, (Silicon Processing for the VLSI Era, vol. 1—Process Technology, Lattice Press, 1986, p. 565).*
Aug. 9, 2010 Japanese official action in connection with counterpart Japanese patent Application.

* cited by examiner

*Primary Examiner* — Nadine Norton
*Assistant Examiner* — Mahmoud Dahimene
(74) *Attorney, Agent, or Firm* — Cooper & Dunham LLP (57) ABSTRACT

A method of manufacturing a semiconductor device is disclosed that includes a semiconductor wafer having a main surface including a device chip area, a peripheral area encompassing the device chip area, and a blank area situated between the device chip area and the peripheral area. The method includes the steps of coating the entire main surface of the semiconductor wafer with a positive photosensitive resist, defining an additional exposure area in the blank area, conducting a first exposure process on the peripheral area and the additional exposure area, conducting a second exposure process on the device chip area, removing resist remaining on predetermined areas of the device chip area, the peripheral area and the blank area after conducting the first and second exposure processes for forming a resist pattern, and dry-etching the main surface of the semiconductor wafer by using the resist pattern as a mask.

15 Claims, 5 Drawing Sheets

Prior Art

Prior Art

METHOD OF MANUFACTURING SEMICONDUCTOR DEVICE

BACKGROUND OF THE INVENTION

1. Technical Field of the Invention

This disclosure relates to a method for manufacturing a semiconductor device.

2. Description of the Related Art

In forming a predetermined pattern in a chip area of a semiconductor device during a typical method of manufacturing the semiconductor device, an insulating film or a metal film is deposited on a main surface of a semiconductor wafer, and then a photosensitive resist is coated on the film deposited on the main surface of the semiconductor wafer. Then, exposure is performed on the wafer by using, for example, a stepper (including stepping projection apparatus, reduced projection exposing apparatus) or an aligner (reflection type equal magnification exposing apparatus). Then, the photosensitive resist covering a predetermined area(s) is selectively removed by performing a developing process on the semiconductor wafer. Thereby, a resist pattern is formed on the semiconductor wafer. Then, a dry-etching process is performed on the semiconductor wafer on which the resist pattern is formed. Thereby, a pattern including the insulation film or the metal film is formed on the device chip area of the semiconductor wafer.

In the above-described manufacturing method, there is a part in a peripheral area of the semiconductor wafer which is not exposed. In such area, there is some photosensitive resist remaining even after performing the developing process. The photosensitive resist remaining in the peripheral area of the semiconductor wafer may become the cause in the creation of undesired foreign matter in subsequent steps (processes) of the manufacturing method.

For preventing this problem from occurring, the peripheral part or the back surface of the semiconductor wafer is cleansed with thinner after the photosensitive resist is coated on the front surface Furthermore, prior to performing the developing process, the peripheral part of the semiconductor wafer is exposed for removing resist in the peripheral part of the semiconductor wafer.

Meanwhile, in the dry-etching process for forming patterns in the device chip area, an end-point detecting method is used. The end-point detecting method is a method that includes monitoring the plasma during the etching process, detecting a light of a predetermined waveform emitted from a target substance, and determining that the dry-etching process is finished according to the rate of change of the intensity of the emitted light.

In recent years and continuing, semiconductor devices are being manufactured in finer sizes and the open area ratio of resist patterns on semiconductor wafers are becoming smaller. As the open area ratio of resist patterns become smaller, the amount of light of the predetermined waveform emitted from the target substance decreases and the rate of change of the intensity of the emitted light becomes smaller. As a result, the precision in detecting the end-point in the end-point detecting method used in the etching process becomes lower due to the small rate of change. In other words, a resist pattern on a semiconductor wafer is to have a sufficient open area ratio in order to satisfactorily use the end-point detecting method in the etching process. Here, "open area ratio" refers to the proportion of an opening area formed in a main surface of a semiconductor wafer with respect to the entire area of the main surface of the semiconductor wafer.

Figure 6A:
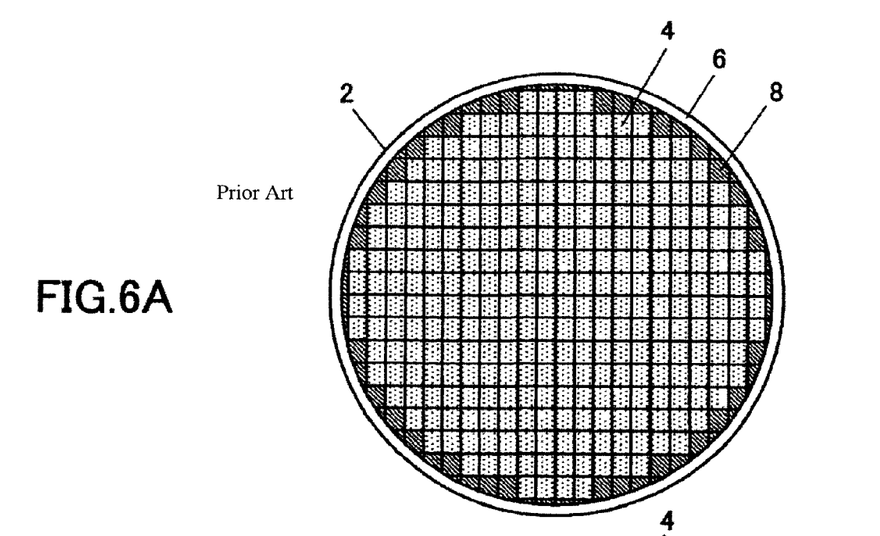
FIG. 6 is a plan view of a semiconductor wafer for describing a conventional semiconductor device manufacturing method.

The above-described process of exposing the peripheral part of the semiconductor wafer (periphery exposure process) is also for increasing the open area ratio of the resist pattern on the semiconductor wafer. As shown in FIG. 6A, a periphery exposure apparatus is used for exposing a strip-like area 6 along the peripheral part of the semiconductor wafer 2 before performing the developing process on the semiconductor wafer 2. After performing the periphery exposure process, the developing process is performed on the semiconductor wafer for removing resist from the peripheral area 6 of the semiconductor wafer 2. Thereby, the open area ratio of the resist pattern (which is to be dry-etched) on the main surface of the semiconductor wafer 2 is increased. It is to be noted that reference numeral 4 of FIG. 6A indicates a device chip area and reference numeral 8 of FIG. 6A indicates a non-element forming area (i.e. an area in which no element is formed).

Figure 6B:
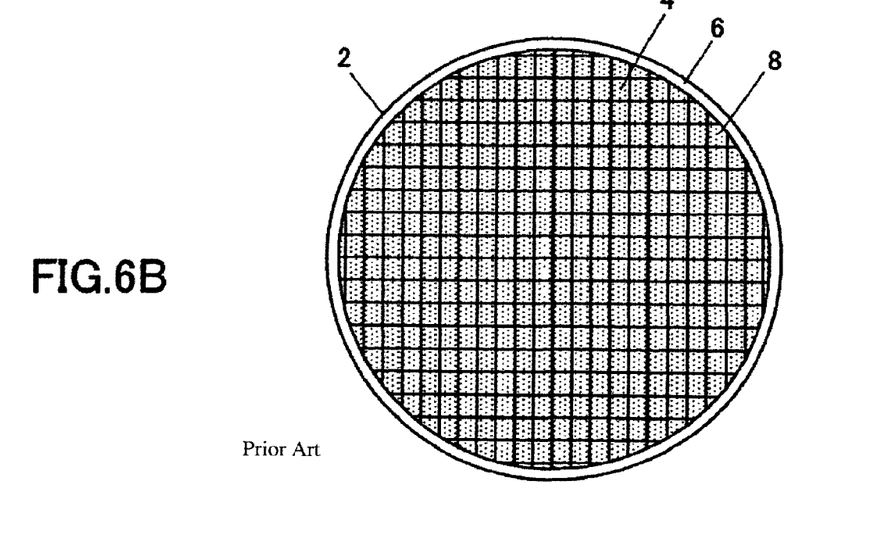

As another method for increasing the open area ratio of the resist pattern on the semiconductor wafer 2, the non-element forming area 8 situated between the device chip area 4 and the peripheral area 6 is subjected to the same pattern exposing process performed on the device chip area 4 (dummy shot) as shown in FIG. 6B.

It is, however, difficult to attain an open area ratio sufficient for detecting the end-point of the dry-etching process by merely removing the resist in the peripheral area 6 of the semiconductor wafer 2 (as shown in FIG. 6A).

Furthermore, in a case where the width of the peripheral area 6 is formed wider for attaining an open area ratio sufficient for detecting the end-point of the dry-etching process, the area of the device chip area 4 becomes smaller. Accordingly, the number of device chips that can be formed on a single semiconductor becomes fewer. This leads to a problem of reduction of productivity.

Furthermore, as shown in FIG. 6B, even if the non-element forming area 8 is subjected to the same pattern exposing process as the device chip area 4, the patterns are too fine that an open area ratio sufficient for detecting the end-point of the dry-etching process cannot be attained. Furthermore, in a case of performing an exposing process on the non-element forming area 8 by using the same method for performing the exposing process on the device chip area 4, an exposure apparatus used for performing a pattern exposure process on the device chip area (pattern exposure apparatus) is also used for exposing the non-element forming area 8. This causes the number of exposure shots of the pattern exposure apparatus to increase. Accordingly, as the number of shots for exposure increases, the amount of light irradiated to the mirror and the lens of the pattern exposure apparatus increases. The more light is irradiated to the mirror and the lens of the pattern exposure apparatus, the more the mirror and lens become heated. Such increase of heat of the mirror and the lens leads to deformation of the lens and the mirror and also results in the deviation or distortion of the exposure field. Moreover, waiting for the heat of the lens and the mirror to settle to a steady temperature for preventing deformation of the mirror and the lens will slow down productivity in manufacturing the semiconductor device.

Conventionally, given that an open area ratio sufficient for detecting the end-point of the dry-etching process cannot be increased, the precision for detecting the end-point of the dry-etching process cannot be improved. This results in inconsistency in the outcome of the dry-etching process and difficulty in manufacturing semiconductor products providing a consistent attribute.

Other than the above-described methods, there is a method of dry etching for a fixed amount of time regardless of the open area ratio of the resist pattern on the semiconductor wafer. This method, however, is unable to determine whether the etching target is thoroughly removed by the dry etching. Accordingly, this method also results to inconsistency in the outcome of the dry-etching process.

Furthermore, there is a method of improving the precision of detecting the end-point of the dry-etching process by modifying a dry-etching apparatus being used (See Japanese Laid-Open Patent Application No. 2000-12527). Although the open area ratio of the resist pattern on the semiconductor wafer may be low by using this method, the end-point of the dry-etching process can be precisely detected. However, such precise detection of the end-point can only be achieved by performing some kind of modification on the configuration of the dry-etching apparatus. It is therefore desired to manufacture a semiconductor product providing a consistent attribute without having to modify the configuration of the dry-etching apparatus, and to form a resist pattern having a sufficient open area ratio in a case of using a conventional dry-etching apparatus.

BRIEF SUMMARY

In an aspect of this disclosure, there is provided a method for manufacturing a semiconductor device including a semiconductor wafer having a main surface including a device chip area, a peripheral area encompassing the device chip area, and a blank area situated between the device chip area and the peripheral area, the method comprising the steps of: coating the entire main surface of the semiconductor wafer with a positive photosensitive resist; defining an additional exposure area in the blank area; conducting a first exposure process on the peripheral area and the additional exposure area; conducting a second exposure process on the device chip area; removing resist remaining on predetermined areas of the device chip area, the peripheral area and the blank area after conducting the first and second exposure processes for forming a resist pattern; and dry etching the main surface of the semiconductor wafer by using the resist pattern as a mask.

To achieve these and other advantages and in accordance with the purpose of the invention, as embodied and broadly described herein, the invention provides a method of manufacturing a semiconductor device including a semiconductor wafer having a main surface including a device chip area, a peripheral area encompassing the device chip area, and a blank area situated between the device chip area and the peripheral area, the method comprising the steps of: coating the entire main surface of the semiconductor wafer with a positive photosensitive resist; defining an additional exposure area in the blank area; conducting a first exposure process on the peripheral area and the additional exposure area; conducting a second exposure process on the device chip area; removing resist remaining on predetermined areas of the device chip area, the peripheral area and the blank area after conducting the first and second exposure processes for forming a resist pattern; and dry etching the main surface of the semiconductor wafer by using the resist pattern as a mask.

In the method of manufacturing a semiconductor device according to an embodiment of the present invention, the first exposure process may be conducted by using a peripheral exposure apparatus used for exposing the peripheral area.

In the method of manufacturing a semiconductor device according to an embodiment of the present invention, the device chip area may include a plurality of device chip area parts arranged in a matrix form.

In the method of manufacturing a semiconductor device according to an embodiment of the present invention, the device chip area may include a single device chip area part arranged in a center part thereof.

In the method of manufacturing a semiconductor device according to an embodiment of the present invention, the main surface that is dry-etched may include a silicon nitride film, wherein the additional exposure area may be defined so that the resist pattern has an open area ratio of 12% or more.

Other aspects and further features will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1A:
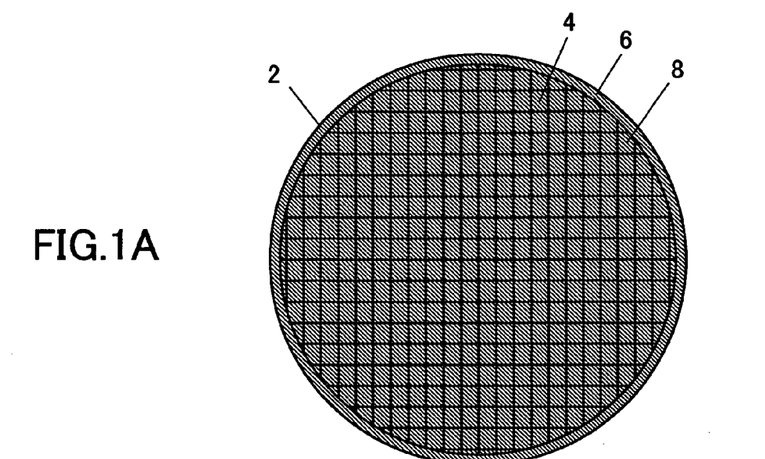
FIGS. 1A-1C are plan views of a semiconductor wafer for describing, step by step, a semiconductor device manufacturing method according to an embodiment of the present invention.
Figure 1B:
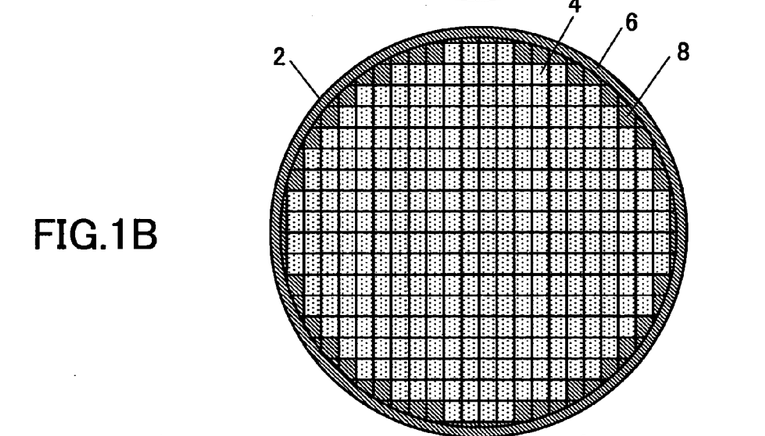
Figure 1C:
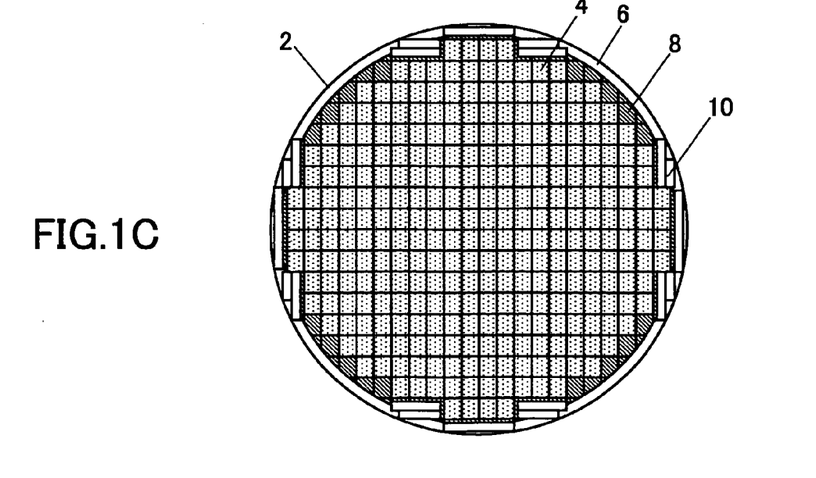

FIGS. 1A-1C are plan views of a semiconductor wafer 2 for describing the procedures (steps) in a semiconductor device manufacturing method according to an embodiment of the present invention.

The semiconductor wafer 2 includes, for example, a semiconductor wafer having a silicon oxide film formed on a silicon substrate and a silicon nitride film formed on the silicon oxide film.

The semiconductor wafer 2 has a main surface on which a device chip area 4 is provided having plural device chip parts arranged in a matrix form. This enables a peripheral area (described in detail below) to be broadened without reducing the area of the device chip area 4. As a result, the open area ratio of the resist pattern of the semiconductor wafer 2 can be increased without lowering the productivity of manufacturing the semiconductor device including the semiconductor wafer 2. Furthermore, a peripheral area 6 is a strip-like area provided along a peripheral part of the semiconductor wafer 2. The peripheral area 6 has a width of, for example, 4.0 mm. A non-element forming area (i.e. blank area) 8 is situated between the device chip area 4 and the peripheral area 6. The non-element forming area 8 is a part of the semiconductor wafer 2 which is not be used as the device chip area 4.

A positive resist is coated on the entire main surface of the semiconductor wafer 2 (illustrated with diagonal lines in FIG. 1A). Then, the device chip area 4 is exposed by using, for example, a stepper, for forming a predetermined pattern thereon (See FIG. 1B). Then, the peripheral area 6 of the semiconductor wafer 2 is exposed by using a periphery exposure apparatus (periphery exposure process). It is to be noted that a "periphery exposure apparatus" in this embodiment is an apparatus configured to expose, for example, a peripheral part of the semiconductor wafer 2 by irradiating a strip-like light beam having a predetermined width onto the semiconductor wafer 2 where the semiconductor wafer 2 is rotated on a stage. By adjusting the trajectory of the stage that supports the semiconductor wafer 2, the periphery exposure apparatus can expose a straight linear area or an arcuate area. Accordingly, by using the periphery exposure apparatus for exposing an additional exposure area, a straight linear area or an arcuate area of the non-element forming area (blank area) 8 can be exposed without having to use a pattern exposure apparatus dedicated for or mainly used for exposing the device chip area 4 of the semiconductor wafer 2.

After the periphery exposure process, an additional exposure area 10 (in this example, a straight linear area) is defined (allocated) in the non-element forming area 8. Then, the additional exposure area 10 is exposed by employing the periphery exposure apparatus which is used for exposing the peripheral exposure area 6. The additional exposure area 10 is defined (allocated) at an area spaced apart from the device chip area 4. For example, the additional exposure area 10 may be spaced 0.3 mm apart from the device chip area 4. By allocating the additional exposure area 10 at an area spaced apart from the device chip area 4, the device chip area 4 can be prevented from being inadvertently exposed in a case where, for example, a target exposure area is accidentally deviated during exposure of the additional exposure area 10.

Then, the positive photosensitive resist remaining on the exposed device chip area 4, the peripheral area 6, and the additional exposure area 10 is thoroughly removed by performing a developing process on the semiconductor wafer 2. It is to be noted that "developing process" refers to not only a process of removing the exposed photosensitive resist by dissolving the resist with a developer but also includes a process of washing away the developer adhered to the semiconductor wafer 2. Thereby, a resist pattern for a subsequent dry-etching process is formed on the semiconductor wafer 2 (See FIG. 1C).

After the resist pattern is formed on the semiconductor wafer 2, the resist pattern is used as a mask when performing the dry-etching process on the semiconductor wafer 2. The dry-etching process is performed by using, for example, an electrostatic chuck type dry-etching apparatus. When dry etching the semiconductor wafer 2, a light is emitted from a substance situated on the uppermost surface of an area of the semiconductor wafer 2 which is not covered by the resist pattern. Such emitted light is measured, and changes in the intensity of the emitted light are detected. Accordingly, an end-point of the dry-etching process is detected based on the rate of change in the intensity of the emitted light.

In this embodiment, since a portion of the resist on the peripheral part 6 and the non-element forming area 8 is removed, the open area ratio of the resist pattern used for the dry-etching process can be increased. Such increased open area ratio increases the detectable intensity of the light having a predetermined wavelength, the intensity being measured during the dry-etching process. Accordingly, the precision of detecting the end-point of the dry-etching process can be improved. Thus, the dry-etching process can be performed more precisely. As a result, semiconductor products can be stably manufactured.

Figure 2A:
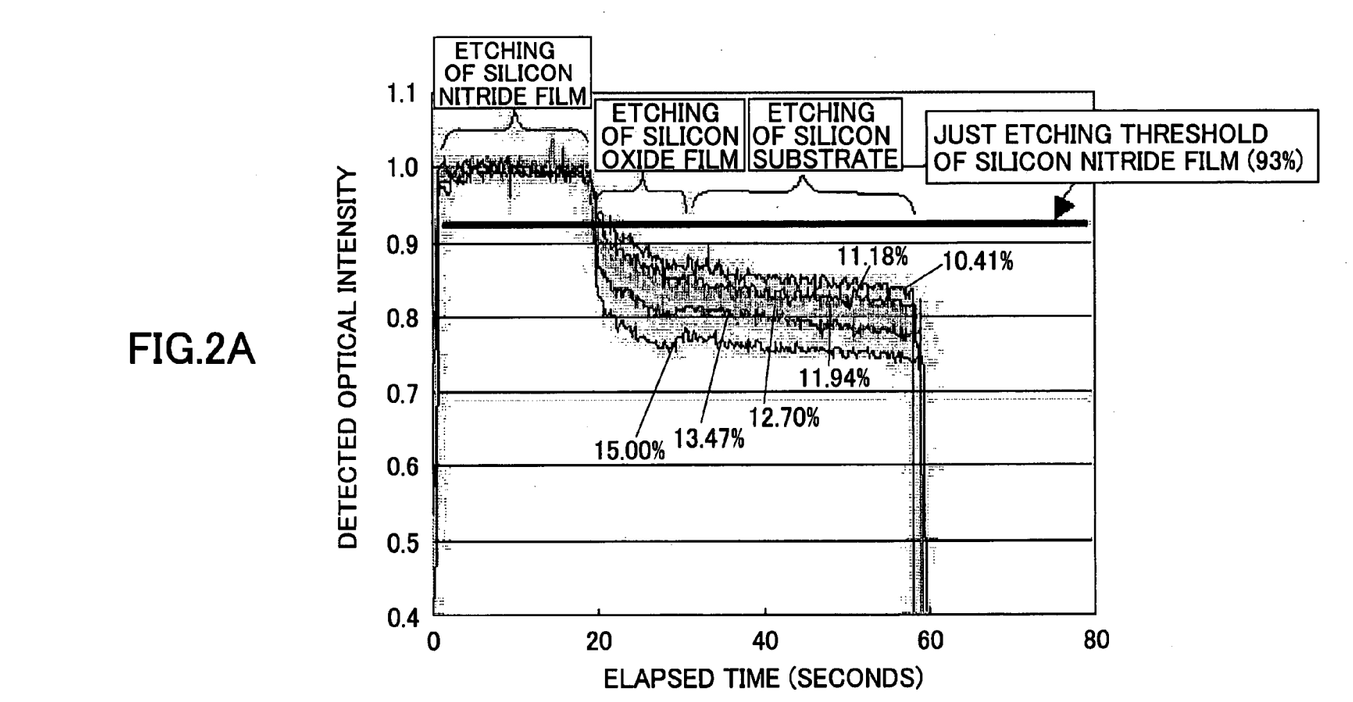
FIGS. 2A-2B are diagrams for describing a relationship between the open area ratio of a resist pattern formed on a semiconductor wafer and the precision of detecting the end-point of a dry-etching process according to an embodiment of the present invention.
Figure 2B:
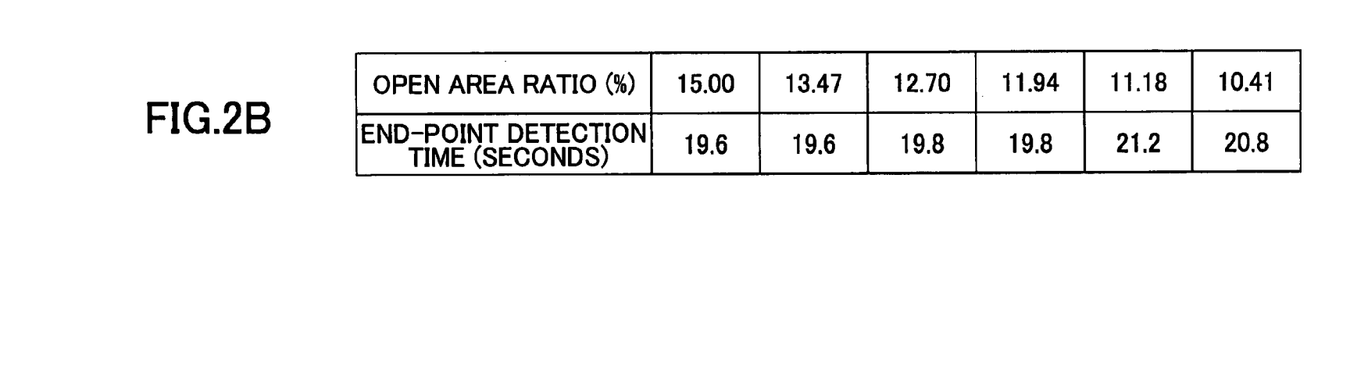

FIGS. 2A and 2B are diagrams for describing a relationship between open area ratios of a resist pattern and the precision of detecting the end-point of a dry-etching process. More specifically, FIG. 2A is a graph showing the results of measuring the detectable intensity of a light having a wavelength of 337 nm in a case of dry etching a semiconductor wafer 2 having resist patterns of various open area ratios formed on its main surface. In this embodiment, the open area ratios of the resist patterns are 15.00%, 13.47%, 12.70%, 11.94%, 11.18%, and 10.41%. In FIG. 2A, the horizontal axis indicates the time elapsed after starting the dry-etching process, and the vertical axis indicates the detectable intensity of a light having a wavelength of 337 nm which light is emitted from the uppermost surface of the semiconductor wafer 2. FIG. 2B is a table showing the relationships between an open area ratio of a resist pattern and the time for detecting an end-point of a process of dry etching a silicon nitride film.

It is to be noted that the semiconductor wafer 2 used in the dry-etching process has a silicon oxide film of 25 nm formed on the surface of a silicon substrate and a silicon nitride film of 100 nm formed on the silicon oxide film. The dry-etching process in this embodiment is performed under the conditions where the pressure is 200 mTorr (26.66 Pa), the RF power is 200 W, and the etching gas is $SF_6$: 100 sccm and He: 30 sccm.

In this embodiment, "open area ratio" refers to the proportion of an opening part(s) formed in the device chip area 4, the peripheral area 6, and the non-element forming area 8 of the semiconductor wafer 2 with respect to the entire area of the main surface of the semiconductor wafer 2. By defining an additional exposure area 10 (see FIG. 1C) and exposing the additional exposure area 10, the open area ratio can be increased.

Furthermore, in the dry-etching process, the threshold of the detectable intensity corresponding to the time when completing the dry-etching process (just etching) of the silicon nitride film is set to 93% of the detectable intensity corresponding to the time when starting the dry etching of the silicon nitride film. The "end-point detection time" in FIG. 2B is the time elapsed from starting a dry-etching process to when the detectable intensity becomes 93% of the detectable intensity corresponding to the time when starting the dry etching of the silicon nitride film.

According to FIGS. 2A and 2B, it is apparent that the end-point detection time becomes more consistent as the open area ratio of the resist pattern becomes higher. Furthermore, in a case where the open area rate of the resist pattern is 15.00%, 13.47%, 12.70%, and 11.94%, a consistent end-point detection time ranging between 19.6 seconds to 19.8 seconds is attained. On the other hand, in a case where the open area rate of the resist pattern is 11.18%, the end-point detection time is 21.2 seconds; in a case where the open area rate of the resist pattern is 10.41%, the open area rate of the resist pattern is 20.8 seconds. This shows that the end-point detection time for the case where the open area rate of the resist pattern is 10.41% and the end-point detection time for the case where the open area rate of the resist pattern is 11.18% is inconsistent (delay of more than one second). According to these results, end-point detection can be performed consistently when the open area ratio of the resist pattern is approximately 12% or more in a case of dry-etching the silicon nitride film formed on the silicon oxide film. That is, since a steady sensitivity can be attained for detecting the wavelength of the light emitted from the target etching film (in this example, silicon nitride film) in the end-point detection operation of the dry-etching process, the dry-etching process can be steadily performed with high precision.

Conventionally, only an open area ratio of approximately 7% at most can be attained after exposing and developing the photosensitive resist covering the peripheral part 8 of the semiconductor wafer 2 (See, for example, FIG. 6A). Furthermore, an open area ratio of a small percentage can only be attained even when performing an exposure process on the non-element forming area 8 in the same manner performed on the device chip area 4. Accordingly, as described above, it is difficult to attain an open area ratio of 12% for the resist pattern used a mask for a dry-etching process merely by employing the conventional semiconductor manufacturing method.

In this embodiment of the present invention, a photosensitive resist coated on the non-element forming area 8 is exposed by using the periphery exposure apparatus so that the photosensitive resist situated on the exposed area can be thoroughly removed. Thereby, compared to the conventional case of performing the pattern exposure process on the non-element forming area 8 in the same manner as the device chip area 4, an opening part having an area several times larger than that of the conventional case can be obtained. Thus, an open area ratio of 12% or more (e.g. straight linear area) can be attained.

Figure 3B:
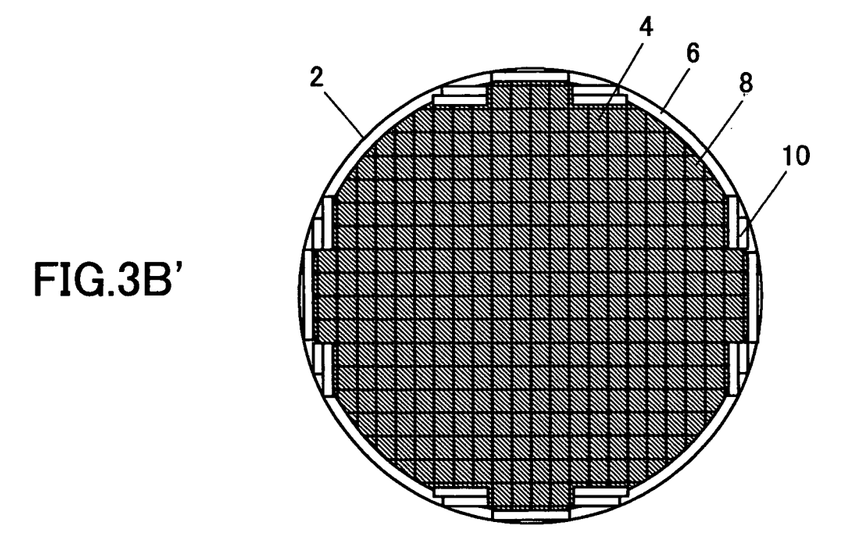
FIGS. 3B' and 3C' are plan views of a semiconductor wafer for describing a semiconductor device manufacturing method according to another embodiment of the present invention.
Figure 3C:
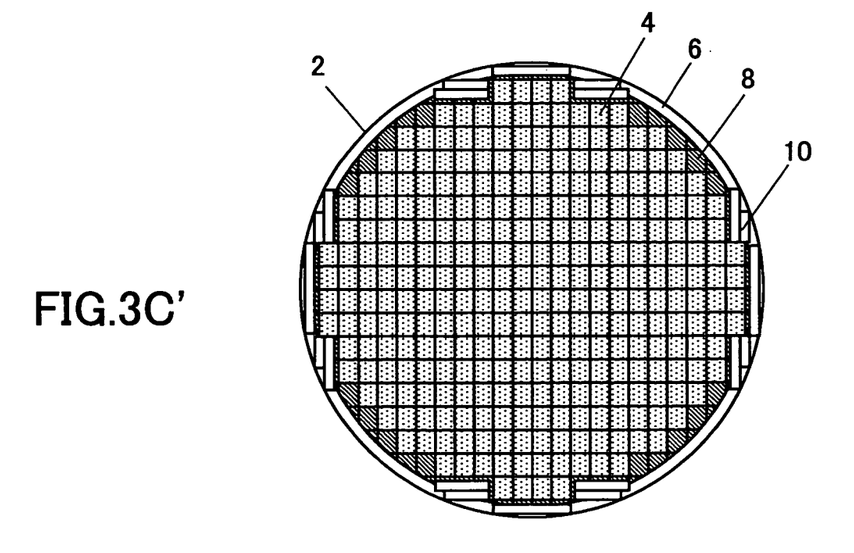

In the semiconductor device manufacturing method described with reference to FIGS. 1A-1C, a photosensitive resist is coated entirely on the main surface of the semiconductor wafer 2 (See FIG. 1A). Then, an exposure process (pattern exposure process) is performed on the device chip area 4 for forming a pattern (element) in the device chip area (See FIG. 1B). Then, another exposure process including a peripheral exposure process and a straight linear exposure process are performed on the peripheral exposure area 6 and the additional exposure area 10 (in this embodiment, the additional exposure area 10 has a straight linear shape) by using the periphery exposure apparatus (See FIG. 1C). Alternatively, the peripheral exposure process and the straight linear exposure process are performed on the peripheral exposure area 6 and the additional exposure area 10 by using the periphery exposure apparatus after the photosensitive resist is coated entirely on the main surface of the semiconductor wafer 2 (See FIG. 3B'). Then, after performing the peripheral exposure process and the straight linear exposure process, the pattern exposure process may be performed on the device chip area 4 (See FIG. 3C'). The order for exposing the peripheral area 6 and the additional exposure area 10 to not be limited, the additional exposure area may be processed before the peripheral exposure process or visa versa.

Figure 4:
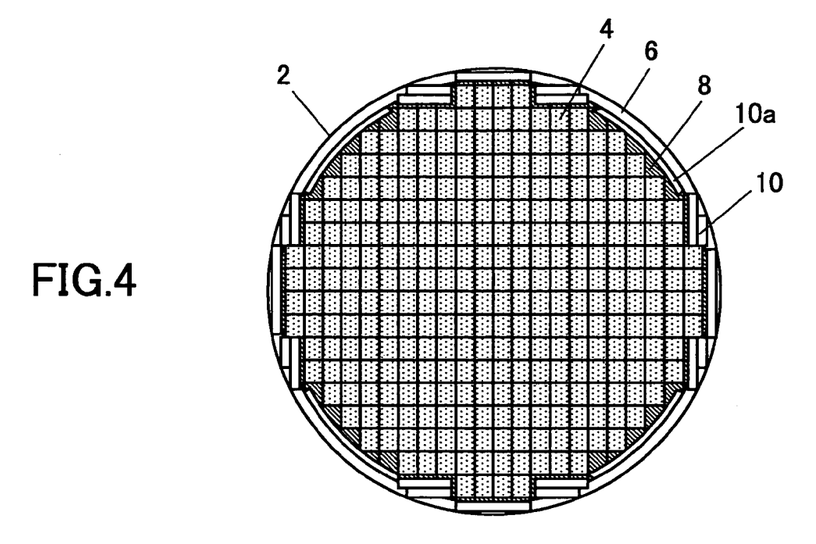
FIG. 4 is a plan view of a semiconductor wafer for describing a semiconductor device manufacturing method according to yet another embodiment of the present invention.

Furthermore, as shown in FIG. 4, an arcuate additional exposure area 10a may also be formed at an unexposed non-element forming area 8 or at least at a part by changing the trajectory of the stage on which the semiconductor wafer 2 is mounted (i.e. changing to a trajectory different from the exposure process for forming the straight linear additional exposure area 10) and exposing the non-element forming area 8. Accordingly, by arbitrarily combining the straight linear additional exposure area 10 and the arcuate additional exposure area 10a, a separate area different from the device chip area 4 can be obtained. By exposing the separate area, a large opening part can be formed in the resist pattern. Accordingly, an opening area ratio sufficient for precisely detecting the end-point of the dry-etching process can be attained.

It is to be noted that, although both the straight linear additional exposure area 10 and the arcuate additional exposure area 10a are arranged in the semiconductor wafer 2 (see FIG. 4), only the arcuate additional exposure area 10a may be arranged in the semiconductor wafer 2. Furthermore, the shape of the additional exposure area 10 is not to be limited to the straight linear shape or the arcuate shape. That is, various shapes which can be exposed by the exposing apparatus can be arranged as the additional exposure area in the non-element forming area.

Figure 5:
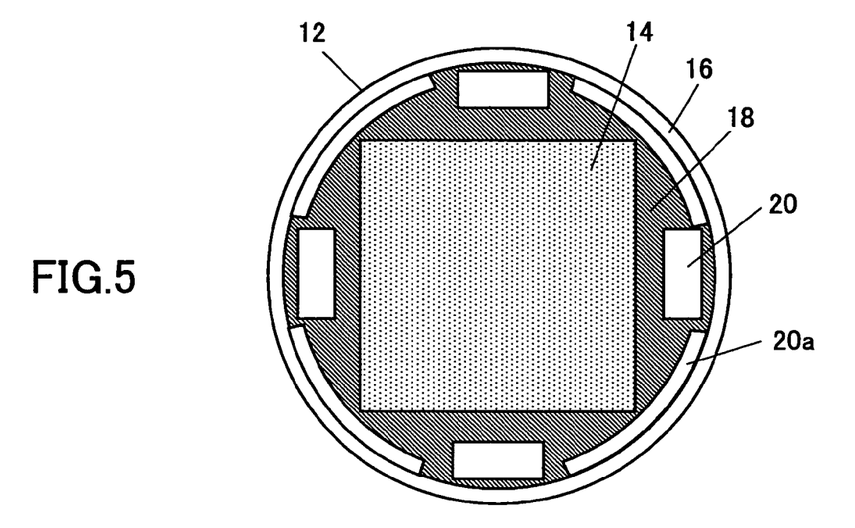
FIG. 5 is a plan view of a semiconductor wafer for describing a semiconductor device manufacturing method according to yet another embodiment of the present invention.

FIG. 5 is a plan view showing a semiconductor wafer 12 for describing a method of manufacturing a semiconductor wafer formed with a single device chip area according to an embodiment of the present invention. In the semiconductor wafer 12 having a single device chip area 14, a relatively large unexposed non-element forming area 18 is arranged in an area separate from the device chip area 14. In a case where an open area ratio large enough to detect the end-point of the dry-etching process cannot be attained for the resist pattern on the semiconductor wafer by merely exposing the peripheral area 16, a straight linear exposure area 20 and/or an arcuate exposure area 20a may be arranged in the area separate from the device chip area 14. By exposing the straight linear exposure area 20 and/or the arcuate exposure area 20a, the area (size) of the opening part of the resist pattern can be increased so that the open area ratio of the resist pattern can be increased. By attaining an open area ratio sufficient for accurately detecting the end-point of the dry-etching process, the dry-etching process can be performed with consistency. Thereby, semiconductor products can be manufactured more consistently.

Although both the straight linear additional exposure area 20 and the arcuate additional exposure area 20a are illustrated in FIG. 5, either one of the additional exposure areas may be provided on the semiconductor wafer 12.

The semiconductor wafer (i.e. semiconductor substrate) 2 of this embodiment of the present invention is not limited to a semiconductor wafer having a silicon oxide film formed on a silicon substrate and a silicon nitride film formed on the silicon oxide film. For example, the film or parts of the semiconductor wafer 2 may alternatively be formed of various materials other than the above-described silicon nitride or silicon oxide. Furthermore, the results shown in the diagrams of FIGS. 2A and 2B are simply examples of performing a dry-etching process on a silicon nitride film formed on a silicon oxide film. The dry-etching process in the semiconductor device manufacturing method of the present invention may also be performed on other substances and still attain a high open area ratio for improving the precision in detecting the end-point of the dry-etching process. For example, the dry-etching process may be performed on a silicon oxide film formed on a silicon substrate, a silicon oxide film formed on a silicon nitride film, or a silicon substrate.

Since the semiconductor wafer 2, 12 according to the above-described embodiment of the present invention is dry-etched by using an electrostatic type dry-etching apparatus which does not require a fixing member for fixing the semiconductor wafer 2, 12 to a stage, the "open area ratio" of the resist pattern formed on the main surface of the semiconductor wafer 2, 12 is defined as the proportion of an opening part of a resist pattern with respect to the entire main surface of the semiconductor wafer 2, 12. However, in a case where a fixing member for fixing the semiconductor wafer 2, 12 on a stage is situated within the area of the main surface of the semiconductor wafer 2, 12, the "open area ratio" in this case refers to the proportion of an opening part of a resist pattern with respect to an area subtracting the area of the fixing member from the area of the entire main surface of the semiconductor wafer 2, 12.

Although the above-described additional exposure areas 10, 10a, 20, and/or 20a are arranged in the positive photosensitive resist covering a portion of the non-element forming area 8, 18 can be removed, the additional exposure areas 10, 10a, 20, and/or 20a may also be arranged in a manner that the positive photosensitive resist covering the entire area of the non-element forming area 8, 18 can be removed.

Further, the present invention is not limited to these embodiments, but variations and modifications may be made without departing from the scope of the present invention.

The present application is based on Japanese Priority Application No. 2005-280684 filed on Sep. 27, 2005, with the Japanese Patent Office, the entire contents of which are hereby incorporated by reference.

What is claimed is:

1. A method for manufacturing a semiconductor device including a semiconductor wafer having a main surface including a device chip area, a peripheral area encompassing the device chip area, and a blank area situated between the device chip area and the peripheral area, the method comprising the steps of:
    coating the entire main surface of the semiconductor wafer with a positive photosensitive resist;
    defining a subject exposure area in the blank area, the subject exposure area being spaced apart from the device area;
    conducting a first exposure process, a second exposure process and a third exposure process at different timings, the first exposure process using a periphery exposure apparatus applying a light beam on the peripheral area, the second exposure process using a second exposure apparatus different from said periphery exposure apparatus on the device chip area, and the third exposure process using the periphery exposure apparatus applying a light beam on the subject exposure area in the blank area situated between the device chip area and the peripheral area;
    removing resist from areas of the device chip area, the peripheral area and the blank area that were exposed in the first second and third exposure processes after conducting the first, second and third exposure processes for forming a resist pattern; and
    dry etching the main surface of the semiconductor wafer using the resist pattern as a mask.

2. The method as claimed in claim 1, wherein the device chip area includes a plurality of device chip area parts arranged in a matrix form.

3. The method as claimed in claim 1, wherein the device chip area includes a single device chip area part arranged in a center part thereof.

4. The method as claimed in claim 1, wherein
    the main surface that is dry-etched includes a silicon nitride film as an outermost layer,
    the subject exposure area is defined so that the resist pattern has an open area ratio of 12% or more, and
    the open area ratio is a portion of an opening area formed in the main surface of the semiconductor wafer with respect to the entire area of the main surface of the semiconductor wafer.

5. The method as claimed in claim 1, wherein the second exposure apparatus is a pattern exposure apparatus.

6. The method as claimed in claim 1, wherein the periphery exposure apparatus exposes the semiconductor wafer as a relative movement is caused by a stage between the periphery exposure apparatus and the semiconductor wafer.

7. The method as claimed in claim 6, wherein the relative movement caused by the stage is at least one of a rotational movement, a linear movement, and a combined rotational and linear movement.

8. The method as claimed in claim 1, wherein the subject exposure area is spaced apart from the device area by at least 0.3 mm measured along the surface of the semiconductor wafer.

9. The method as claimed in claim 1, wherein the dry etching step is terminated when a light intensity detector detects that a rate of change of an intensity of light emitted from a substance on the semiconductor wafer reaches a predetermined value.

10. The method as claimed in claim 1, wherein the subject exposure area is at least one of a straight linear shape and an arcuate shape.

11. The method as claimed in claim 1, wherein the resist pattern in the device chip area has an open area that is less than an open area of the resist pattern in the subject exposure area.

12. The method as claimed in claim 1, further comprising the step of
    fixing the semiconductor wafer to a stage with at least one fixing member, wherein
    a portion of the main surface of the semiconductor wafer is covered by the at least one fixing member,
    the subject exposure area is defined so that an open area ratio of the resist pattern on the main surface of the semiconductor wafer not covered by the at least one fixing member is 12% or more, and
    the open area ratio is a portion of an opening area formed in the main surface of the semiconductor wafer with respect to the entire area of the main surface of the semiconductor wafer.

13. The method as claimed in claim 1, wherein the light beam of the periphery exposure apparatus is strip-like and has a predetermined width.

14. The method as claimed in claim 1, wherein the subject exposure area is defined so that the resist pattern has an open area of 12% or more of the main surface of the semiconductor wafer and so that the resist pattern in the subject exposure area has an open area of at least 5% of the main surface of the semiconductor wafer.

15. A method for manufacturing a semiconductor device including a semiconductor wafer having a main surface including a device chip area, a peripheral area encompassing the device chip area, and a blank area situated between the device chip area and the peripheral area, the method comprising the steps of:
    coating the entire main surface of the semiconductor wafer with a positive photosensitive resist;
    defining a subject exposure area in the blank area, the subject exposure area being spaced apart from the device area and being at least one of a straight linear shape and an arcuate shape;
    conducting a first exposure process, a second exposure process and a third exposure process at different timings, the first exposure process using a periphery exposure apparatus applying a light beam on the peripheral area, the second exposure process using a second exposure apparatus different from said periphery exposure apparatus on the device chip area, and the third exposure process using the periphery exposure apparatus applying a light beam on the subject exposure area in the blank area situated between the device chip area and the peripheral area;
    removing resist from areas of the device chip area, the peripheral area and the blank area that were exposed in the first, second and third exposure processes to form a resist pattern;
    conducting a dry etching process on the main surface of the semiconductor wafer using the resist pattern as a mask;

measuring an intensity of light emitted during the dry etching process; and determining an end point of the dry etching process based on the measured intensity of the emitted light, wherein the subject exposure area is defined so that the resist pattern on the entire main surface of the semiconductor wafer has an open area of 12% or more.

* * * * *